(12) United States Patent
Takeoka

(10) Patent No.: US 6,205,566 B1
(45) Date of Patent: Mar. 20, 2001

(54) SEMICONDUCTOR INTEGRATED CIRCUIT, METHOD FOR DESIGNING THE SAME, AND STORAGE MEDIUM WHERE DESIGN PROGRAM FOR SEMICONDUCTOR INTEGRATED CIRCUIT IS STORED

(75) Inventor: Sadami Takeoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/119,589

(22) Filed: Jul. 21, 1998

(30) Foreign Application Priority Data

Jul. 23, 1997 (JP) .................................................. 9-196621

(51) Int. Cl.[7] .................................................. G01R 31/28
(52) U.S. Cl. .................................................. 714/726
(58) Field of Search .................................. 714/726, 727, 714/721, 731; 326/41, 47, 101

(56) References Cited

U.S. PATENT DOCUMENTS

| 4,377,757 | * | 3/1983 | Könemann et al. | 307/303 |
|---|---|---|---|---|
| 4,864,579 | * | 9/1989 | Kishida et al. | 371/22.3 |
| 4,896,060 | * | 1/1990 | Ma | 307/482.1 |
| 5,313,470 | | 5/1994 | Simpson | 371/22.3 |
| 5,341,096 | * | 8/1994 | Yamamura | 324/765 |
| 5,617,428 | * | 4/1997 | Andoh | 371/22.3 |
| 5,650,734 | * | 7/1997 | Chu et al. | 326/38 |
| 5,680,583 | | 10/1997 | Kuijsten | 395/500 |
| 5,726,998 | * | 3/1998 | Ozaki | 371/22.31 |
| 5,742,617 | * | 4/1998 | Warren | 371/22.31 |
| 5,777,489 | | 7/1998 | Barbier et al. | 326/40 |
| 5,812,562 | * | 9/1998 | Baeg | 371/22.31 |
| 5,829,015 | * | 10/1998 | Maeno | 714/104 |
| 5,898,776 | * | 4/1999 | Apland et al. | 380/3 |
| 5,987,635 | * | 11/1999 | Kishi et al. | 714/724 |
| 6,003,107 | * | 12/1999 | Ransom et al. | 710/131 |
| 6,014,752 | * | 1/2000 | Hao et al. | 713/500 |
| 6,020,760 | * | 2/2000 | Sample et al. | 326/41 |

FOREIGN PATENT DOCUMENTS

| 59-175133 | 3/1984 | (JP) . |
|---|---|---|
| 59-180467 | 10/1984 | (JP) . |
| 61-234376 | 10/1986 | (JP) . |
| 62-169066 | 7/1987 | (JP) . |
| 05122022 | 5/1993 | (JP) . |

* cited by examiner

*Primary Examiner*—Albert De Cady
*Assistant Examiner*—Samuel Lin
(74) *Attorney, Agent, or Firm*—McDermott, Will & Emery

(57) ABSTRACT

In a semiconductor integrated circuit, a select signal output circuit switches a selector to take in the output of a circuit section in response to a signal "0" received at the D terminal thereof during normal operation. Thus, a scan flip-flop receives the output of the circuit section. During a scan test mode, a select signal "0" or "1" is input through a scan-in terminal to the select signal output circuit and then to the selector. If the select signal is "0", then the selector selects the output of the circuit section. On the other hand, if the select signal is "1", then the selector selects a clock signal supplied from a clock signal generator. The output of the circuit section or the clock signal supplied from the clock signal generator, which has been input to the scan flip-flop, is passed through a scan path and output to the outside through a scan-out terminal. As a result, an internally formed clock signal generator or the like can be tested easily.

28 Claims, 12 Drawing Sheets

SEMICONDUCTOR INTEGRATED CIRCUIT, METHOD FOR DESIGNING THE SAME, AND STORAGE MEDIUM WHERE DESIGN PROGRAM FOR SEMICONDUCTOR INTEGRATED CIRCUIT IS STORED

BACKGROUND OF THE INVENTION

The present invention relates to a semiconductor integrated circuit (in particular, an improved semiconductor integrated circuit for testing internal circuits for failures through a scan test), a method for designing the semiconductor integrated circuit, and a storage medium in which the design program therefor is stored.

In general, it is difficult to test logic circuits constituting a semiconductor integrated circuit (among other things, logic circuits for generating clock signals, reset signals and set signals) by utilizing a scan path.

More specifically, in a conventional semiconductor integrated circuit, a clock signal generated by a logic circuit (i.e., a clock signal generator) is selected by a selector and input to a predetermined storage device such as a flip-flop during normal operation. In a scan mode, however, not the clock signal generated by the clock signal generator, but an externally supplied scan clock signal is selected by the selector and input to the storage device. Thus, in the conventional circuit, the clock signal generated by the clock signal generator is valid during the normal operation, but is invalidated in the scan mode. Accordingly, in the scan mode, it is impossible to test the clock signal generator.

In order to solve such a problem, a circuit for testing a clock signal generator and the like (herein represented by the "clock signal generator") by providing some means for monitoring the signals generated by the generator is provided and disclosed in Japanese Laid-Open Publication No. 61-234376, for example. More specifically, a selector is provided between the output of the clock signal generator and a storage device responsive to the clock signals. During the normal operation, the selector selects the clock signals generated by the clock signal generator. On the other hand, in the scan mode, the selector selects an externally provided test clock signal and provides the signal to the storage device, thereby performing a scan test. Furthermore, an external output terminal for monitoring is provided, a signal line connecting the clock signal generator to the selector is branched and the branch of the signal line is connected to the external output terminal for monitoring. In this manner, the clock signal generated by the clock signal generator is monitored at the external output terminal, thereby testing the clock signal generator.

However, the conventional circuit requires not only an external terminal for scan testing but also the external output terminal for testing the clock signal generator. Thus, the number of terminals of such a semiconductor integrated circuit is larger than that of an ordinary circuit. Particularly when the number of the clock signal generators provided is large, the number of the external output terminals for testing is also large. In view of the strict limitation recently imposed on the number of terminals of a semiconductor integrated circuit, such a configuration cannot be implemented in some cases. In addition, since the conventional circuit requires the signal line connecting the clock signal generator to the external output terminal for testing, the size of the circuit is adversely increased. Especially when the number of the clock signal generators provided is large, the number of the signal lines also increases correspondingly, thereby further increasing the circuit size.

In order to eliminate such a problem, according to the technique disclosed in Japanese Laid-Open Publication No. 62-169066, for example, a selector is disposed between a logic circuit and a storage device, such as flip-flop, for storing the output of the logic circuit. The selector selectively provides the clock signal, generated by the clock signal generator, to the storage device. In the scan mode, the selector selectively switches the supply of the output of the logic circuit and the clock signal generated by the clock signal generator. The input to the storage device, i.e., the output of the logic circuit or the clock signal provided from the clock signal generator, is monitored at a scan-out terminal. In such a manner, the clock signal generator can be tested while eliminating the external output terminal, through which the output signal of the clock signal generator is output and monitored externally, and the signal line leading to the output terminal.

However, the above-identified publication fails to disclose a specific controller for controlling the selector (corresponding to the select signal output circuit of the present invention). Thus, no detailed information enabling appropriate control and switching of the selector during the normal operation and scan modes is provided by the publication.

SUMMARY OF THE INVENTION

The object of the present invention is eliminating the external output terminal for externally monitoring the output signal of the clock signal generator or the like and the signal line leading to the output terminal and thereby enabling the test of the clock signal generator or the like with ease by providing a select signal output circuit or the like for appropriately controlling the selector.

In order to accomplish this object, a semiconductor integrated circuit according to the present invention includes: a storage device including a data input terminal and a control terminal (such as a clock signal input terminal) and constituting a part of a scan path; a first circuit section for generating data to be supplied to the data input terminal of the storage device during normal operation; and a second circuit section (such as a clock signal generator) for generating a signal to be supplied to the control terminal of the storage device during the normal operation. The semiconductor integrated circuit is characterized by further including: a selector for selecting one of an output signal of the first circuit section and an output signal of the second circuit section and supplying the selected signal to the data input terminal of the storage device; and a select signal output circuit for outputting a select signal, instructing a select operation of the selector, to the selector. The select signal output circuit outputs the select signal instructing that the selector selects the output signal of the first circuit section during the normal operation and outputs the select signal instructing that the selector selects an arbitrary one of the output signal of the first circuit section and the output signal of the second circuit section during testing the semiconductor integrated circuit.

Another semiconductor integrated circuit according to the present invention includes: a first storage device including a control terminal and constituting a part of a scan path; a second storage device including a data input terminal and constituting another part of the scan path; a first circuit section for generating data to be supplied to the data input terminal of the second storage device during normal operation; and a second circuit section for generating a signal to be supplied to the control terminal of the first storage device during the normal operation. The semiconductor integrated circuit is characterized by further including: a selector for selecting one of an output signal of the first circuit section and an output signal of the second circuit section and supplying the selected signal to the data input terminal of the second storage device; and a select signal output circuit for outputting a select signal, instructing a select operation of the selector, to the selector. The select signal output circuit outputs the select signal instructing that the selector selects the output signal of the first circuit section during the normal operation and outputs the select signal instructing that the selector selects an arbitrary one of the output signal of the first circuit section and the output signal of the second circuit section during testing the semiconductor integrated circuit.

In one embodiment of the present invention, the select signal output circuit includes a third storage device constituting the scan path, and the third storage device receives the select signal externally supplied through the scan path and outputs the received select signal to the selector.

In another embodiment of the present invention, the third storage device includes: a data input terminal for always receiving a select signal instructing that the selector selects the output signal of the first circuit section; a scan data input terminal for receiving the select signal externally supplied through the scan path; and an output terminal for outputting the select signal to the selector. The third storage device receives a scan enable signal externally supplied, outputs the select signal, received at the data input terminal, through the output terminal while the scan enable signal is not input, and outputs the select signal, received at the scan data input terminal, through the output terminal while the scan enable signal is input.

The present invention further provides a method for designing the semiconductor integrated circuit and a storage medium in which the design program thereof is stored.

In the semiconductor integrated circuit according to the present invention, the select operation of the selector can be switched easily by the select signal output circuit during testing. Thus, an arbitrary output, i.e., either the output of the first circuit section, constituting a combinational circuit, or the output of the second circuit section implemented as a generator for generating a clock signal, a reset signal and the like, is input to the data input terminal of the storage device constituting the scan path. As a result, the output of the second circuit section can be output and externally monitored by performing the scan operation.

Accordingly, a conventional test-dedicated external output terminal for monitoring the output signals of the clock signal generator and the like is no longer necessary. As a result, the increase in number of terminals can be prevented. Also, it is not necessary to provide a signal line connecting an arbitrary circuit section such as the clock signal generator to the test-dedicated external output terminal, either. As a result, the increase in circuit size can also be prevented. In addition, since the select operation of the selector can be easily switched by the select signal output circuit, the test can be performed with ease.

In particular, in the semiconductor integrated circuit of the present invention, the select signal indicating whether the output of the first circuit section or the output of the second circuit section such as the clock signal generator should be selected is input to the selector through the scan path during testing. Thus, an arbitrary one of the select signals can be selected easily and the test can be performed even more easily.

Moreover, by employing the method for designing a semiconductor integrated circuit of the present invention or the storage medium of the present invention in which the design program therefor is stored, the semiconductor integrated circuit attaining the above-described effects can be designed easily.

DESCRIPTION OF THE PREFERRED EMBODIMENTS

Hereinafter, the preferred embodiments of the present invention will be described with reference to the accompanying drawings.

EMBODIMENT 1

Figure 1:
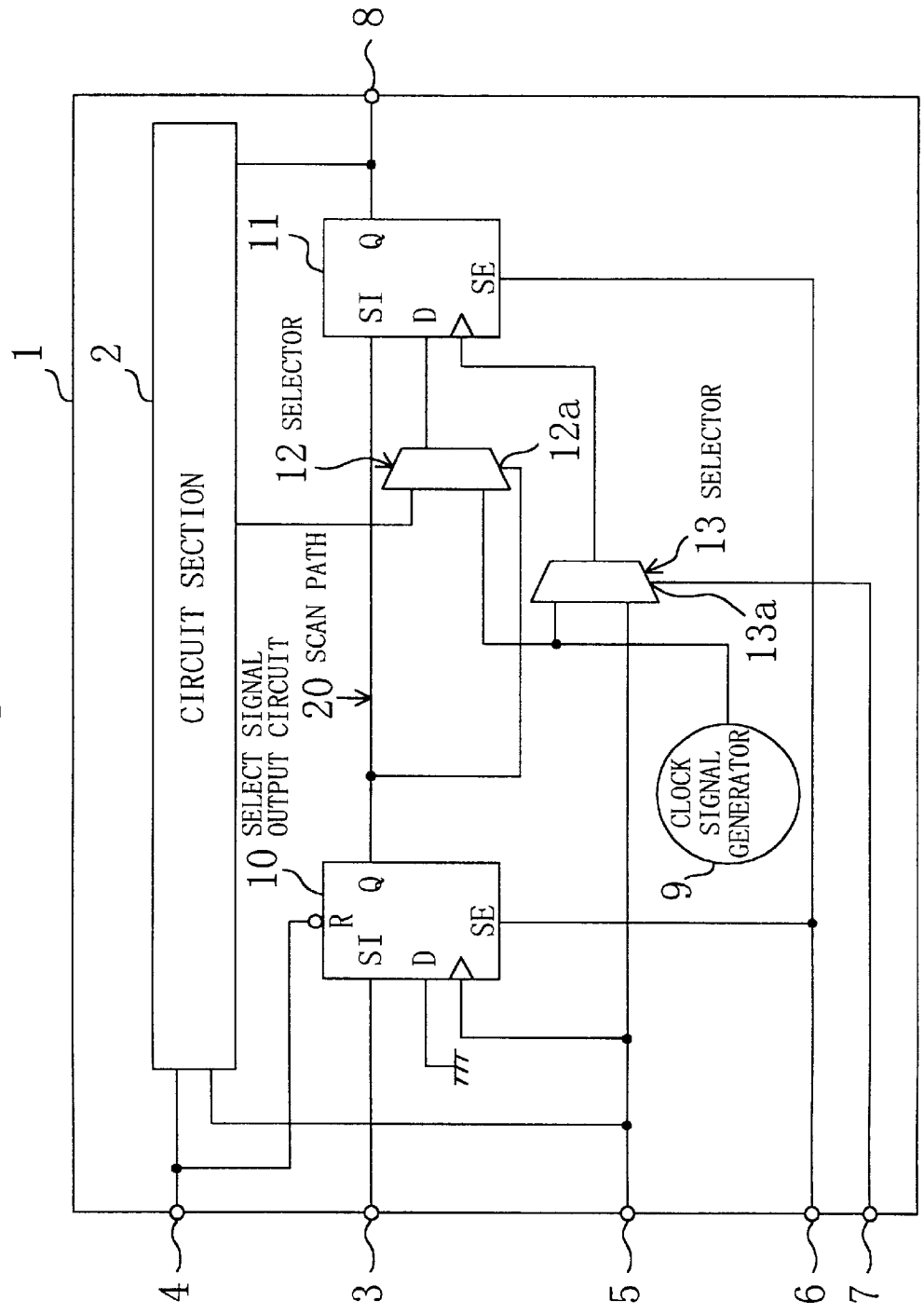
FIG. 1 is a block diagram illustrating the configuration of a semiconductor integrated circuit in the first embodiment of the present invention.

FIG. 1 illustrates a semiconductor integrated circuit in the first embodiment of the present invention.

In FIG. 1, the reference numeral 1 denotes a semiconductor integrated circuit. 3 denotes a scan-in terminal (scan data input terminal). 4 denotes a system reset signal input terminal. 5 denotes a clock signal input terminal, through which a system clock signal is input during normal operation and a scan clock signal is input during a test mode. 6 denotes a scan enable signal input terminal. 7 denotes a test mode signal input terminal. 8 denotes a scan out terminal.

In the semiconductor integrated circuit 1, the reference numeral 2 denotes a circuit section (first circuit section) implemented as a combinational circuit for generating data by performing logical operations and the like during the normal operation. 9 denotes a clock signal generator (second circuit section) for generating a clock signal during the normal operation. 11 denotes a scan flip-flop (storage device). 12 and 13 denote selectors (first and second selectors).

In the scan flip-flop 11, the reference sign SI denotes a scan data input terminal. SE denotes a scan enable signal input terminal. D denotes a normal data input terminal. Q denotes a data output terminal (output terminal) connected to the scan-out terminal 8. If the input at the terminal SE is "0", the data at the terminal D is taken in and out put through the data output terminal Q in synchronism with the clock signal. On the other hand, if the input at the terminal SE is "1", the data at the terminal SI is taken in and output through the data output terminal Q in synchronism with the clock signal. It is noted that the sign > in the scan flip-flop 11 denotes a clock signal input terminal (control terminal).

The s elector 12 includes a select signal input terminal 12a. If the select signal received at the input terminal 12a is "0", the selector 12 selects the output of the circuit section 2. On the other hand, if the select signal is "1", the selector 12 selects the clock signal supplied from the clock signal generator 9. The selector 12 supplies the selected signal as data to the terminal D of the scan flip-flop 11.

The selector 13 includes a select signal input terminal 13a connected to the test mode signal input terminal 7. If the test mode signal at the test mode signal input terminal 7 is "0", the selector 13 selects the clock signal supplied from the clock signal generator 9. On the other hand, if the test mode signal is "1", the selector 13 selects a clock signal externally supplied to the clock signal input terminal 5, i.e., a clock signal supplied from a circuit other than the clock signal generator 9.

The reference numeral 10 denotes a select signal output circuit. The select signal output circuit 10 outputs a select signal to the selector 12, thereby controlling the select operation of the selector 12. The circuit 10 is implemented as a scan flip-flop (third storage device). In the same way as the scan flip-flop 11, the scan flip-flop 10 also includes terminals SI, SE, D, Q and a clock signal input terminal. The scan flip-flop 10 further includes a reset signal input terminal R and functions in the same way as the scan flip-flop 11. The scan-in terminal 3 is connected to the terminal SI of the scan flip-flop 10. The terminal Q of the scan flip-flop 10 is connected to the terminal SI of the scan flip-flop 11. In this manner, a scan path 20 running from the scan-in terminal 3 until the scan-out terminal 8 by way of the select signal output circuit (scan flip-flop) 10 and the scan flip-flop 11 is formed.

In the scan flip-flop 10 constituting the select signal output circuit 10, the terminal D is always grounded, the terminal R is connected to the system reset signal input terminal 4 and the terminal Q is connected to the select signal input terminal 12a of the selector 12. A scan enable signal, which has been externally supplied through the scan enable signal input terminal 6, is input to the terminal SE of the scan flip-flop 10. Thus, if the reset signal at the terminal R is "0" or if the scan enable signal at the terminal SE is "0" (in other words, if the scan enable signal is not input to the terminal SE) and the clock signal has been input, the scan flip-flop 10 outputs the signal "0" at the terminal D as a select signal to the selector 12, thereby making the selector 12 always select the output of the circuit section 2. On the other hand, if the scan enable signal at the terminal SE is "1" and the clock signal has been input and if a select signal has been externally supplied to the scan-in terminal 3, the select signal is input to the terminal SI of the scan flip-flop 10 through the scan path 20. Then, the scan flip-flop 10 outputs the received select signal through the terminal Q to the selector 12 and controls the selector 12 in accordance with whether the select signal is "0" or "1", thereby making the selector 12 select either the output of the circuit section 2 or the clock signal supplied from the clock signal generator 9.

Hereinafter, the operation of the semiconductor integrated circuit of the first embodiment will be described with reference to FIG. 1.

First, during the normal operation, the signals at the scan enable signal input terminal 6 and the test mode signal input terminal 7 are fixed at "0". Thus, the scan flip-flops 10 and 11 take in the signals received at the respective terminals D and operate as normal flip-flops. The selector 13 selects the clock signal supplied from the clock signal generator 9. As described above, the terminal D of the scan flip-flop 10 is grounded. Thus, when a reset signal (=0) is input through the system reset signal input terminal 4 or when the system clock signal is input through the clock signal input terminal 5, the signal at the terminal Q of the scan flip-flop 10 becomes "0". And the signal will remain "0" throughout the normal operation. As a result, the selector 12 always selects the output signal of the circuit section 2.

On the other hand, during the test mode, the test mode signal at the test mode signal input terminal 7 is fixed at "1", and the scan clock signal is supplied through the clock signal input terminal 5. Thus, the selector 13 selects the signal supplied through the clock signal input terminal 5, and the scan flip-flop 11 can perform a scan operation. In such a case, the scan-in terminal 3, the scan flip-flops 10, 11 and the scan-out terminal 8 constitute the scan path 20. If the scan enable signal at the scan enable signal input terminal 6 is set at "1", then the scan flip-flops 10, 11 operate as shift registers, thereby performing scan-in/scan-out operations.

Herein, if the output signal of the circuit section 2 is tested, then the scan-in operation is performed, thereby inputting the select signal "0" through the scan-in terminal 3 to the scan flip-flop 10 through the scan path 20 and taking the signal therein. As a result, the selector 12 selects the output signal of the circuit section 2. Next, by setting the scan enable signal at the scan enable signal input terminal 6 at "0", the signal supplied from the circuit section 2 and selected by the selector 12 is taken in the scan flip-flop 11 through the terminal D. Then, by setting the scan enable signal at the scan enable signal input terminal 6 at "1", a scan-out operation is performed, thereby outputting the signal, which has been supplied from the circuit section 2 and taken in the scan flip-flop 11, to the outside through the scan-out terminal 8. As a result, during the test mode, the output signal of the circuit section 2 can be monitored at the scan-out terminal 8.

On the other hand, if the clock signal generator 9 is tested, then the select signal "1" at the scan-in terminal 3 is input to and taken in the scan flip-flop 10. As a result, the selector 12 selects the clock signal supplied from the clock signal generator 9. The remaining operation is performed in substantially the same way, thereby taking the clock signal supplied from the clock signal generator 9 into the scan flip-flop 11 through the terminal D and outputting the signal through the scan-out terminal 8 to the outside by performing the scan-out operation. In this way, since the clock signal supplied from the clock signal generator 9 can be monitored at the scan-out terminal 8 during the test mode, the clock signal can be monitored through the scan operations without adding any monitoring-dedicated terminal.

Next, a method for designing the semiconductor integrated circuit shown in FIG. 1 by using a computer will be described with reference to the flow chart illustrated in FIG. 2. In actuality, the flow chart is implemented by computer readable programs, which are stored in a storage medium such as a floppy disk or a CD-ROM.

Figure 2:
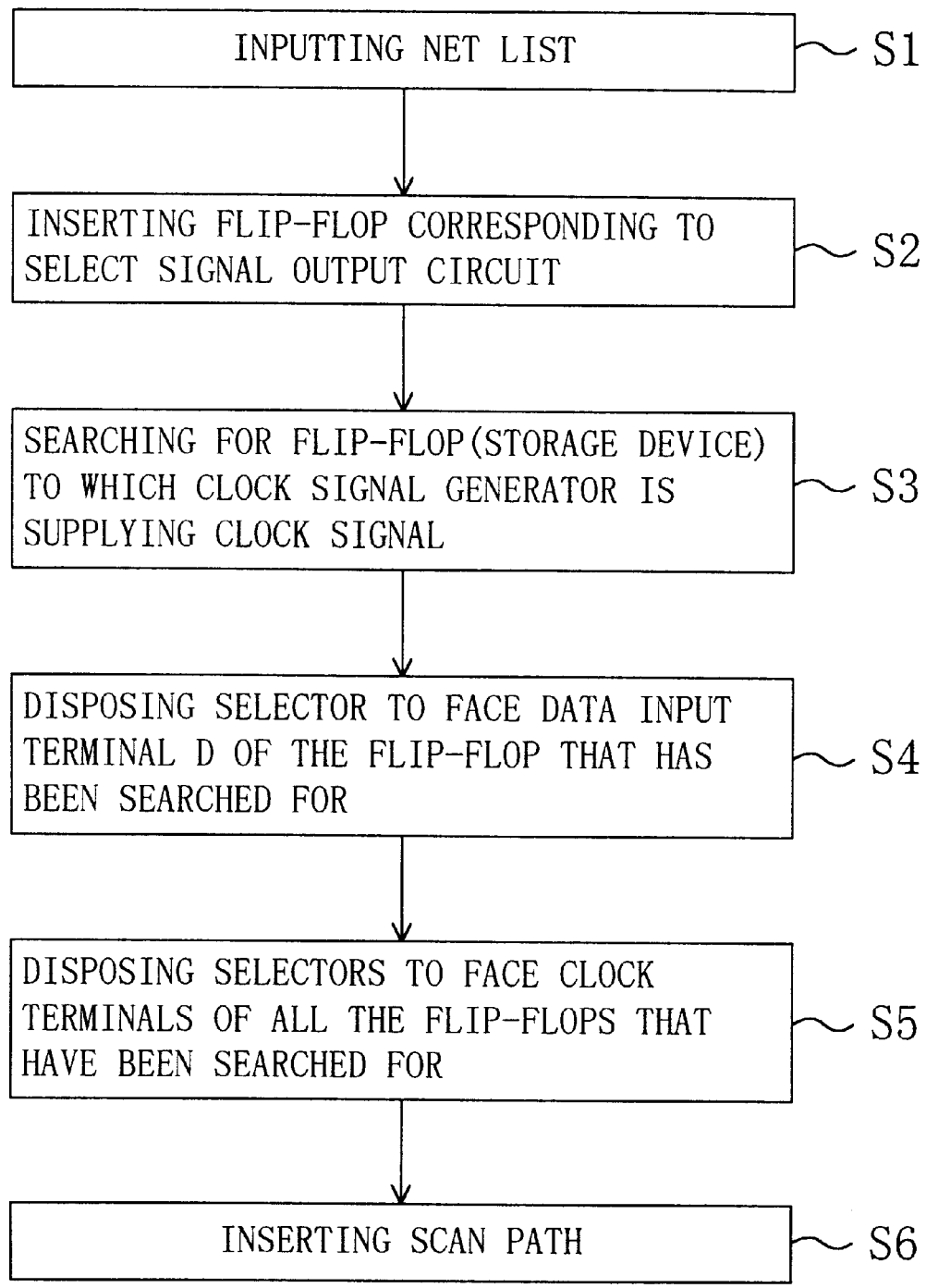
FIG. 2 is a flow chart illustrating a method for designing the semiconductor integrated circuit in the first embodiment of the present invention.
Figure 3:
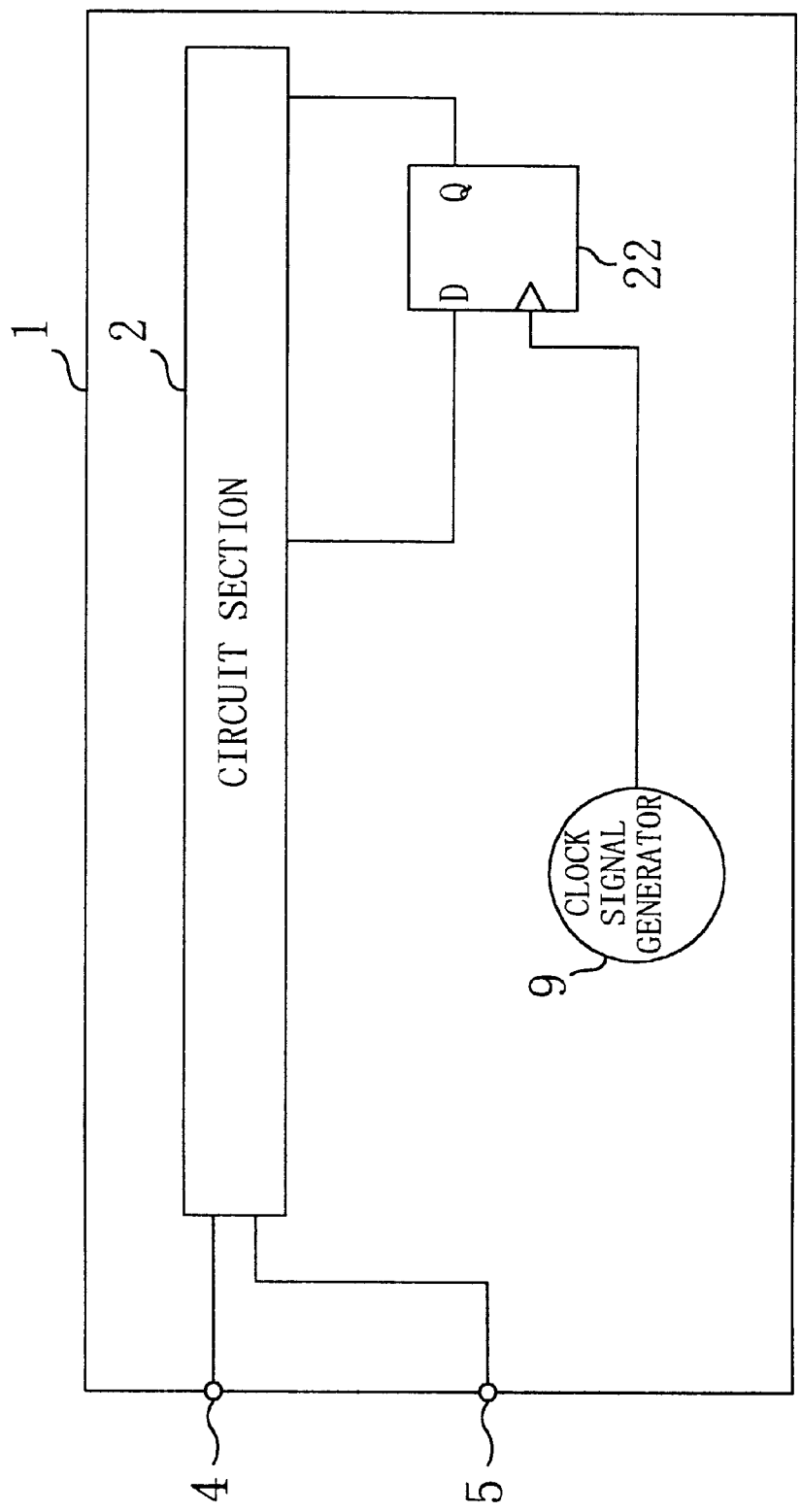
FIG. 3 is a block diagram illustrating the initial circuit configuration of the semiconductor integrated circuit to be tested corresponding to the net list to be input first in the designing method illustrated in FIG. 2.

As shown in FIG. 2, in Step SI, a net list of the semiconductor integrated circuit to be tested and shown in FIG. 3 is input. The semiconductor integrated circuit to be tested basically includes: the circuit section 2; the clock signal generator 9; a flip-flop 22 corresponding to the scan flip-flop 11; the system reset signal input terminal 4; and the clock signal input terminal 5, as shown in FIG. 3.

Figure 4:
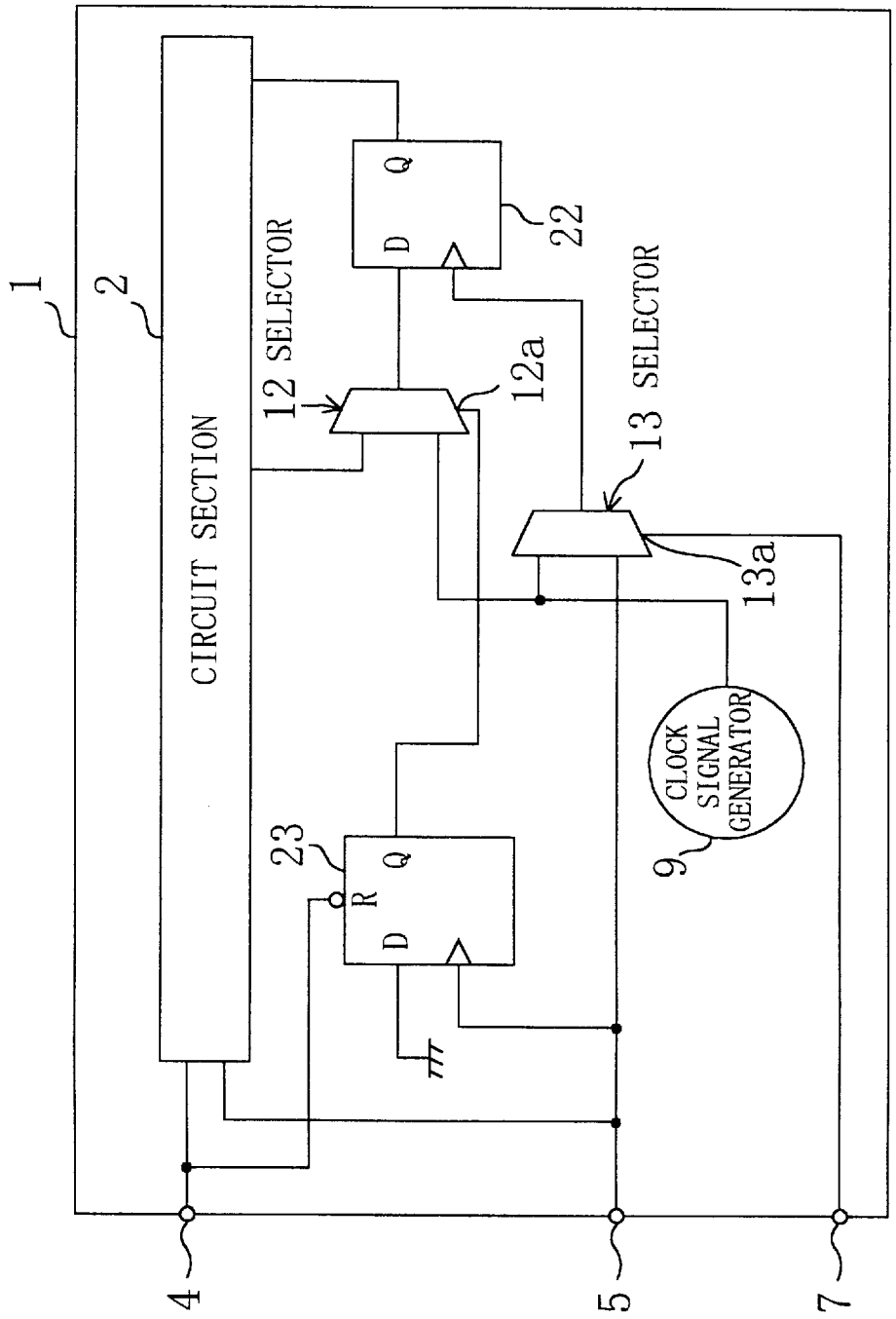
FIG. 4 is a block diagram illustrating the circuit configuration of the semiconductor integrated circuit to be tested at a point in time when a select signal output circuit and selectors have been disposed in accordance with the designing method.

Next, in Step S2, a flip-flop 23 corresponding to the select signal output circuit 10 is inserted into the semiconductor integrated circuit. And the data input terminal D, the reset terminal R and the clock terminal of the flip-flop 23 are connected to the ground, the system reset signal input terminal 4 and the clock signal input terminal 5, respectively, as shown in FIG. 4.

Then, in Step S3, a flip-flop (storage device), to which the clock signal generator 9 is supplying the clock signal, is searched for. In the semiconductor integrated circuit shown in FIG. 3, the flip-flop 22 is searched for.

Subsequently, in Step S4, a selector 12 of a two-input type is disposed to face the data input terminal D of the flip-flop 22 that has been searched for, and the output terminal of the selector 12 is connected to the data input terminal D of the flip-flop 22. In addition, the output terminal Q of the flip-flop 23 corresponding to the select signal output circuit 10 is connected to the select terminal 12a of the selector 12. And the signal supplied from the circuit section 2 during the normal operation and the clock signal supplied from the clock signal generator 9 are connected to the two input terminals of the selector 12. If the signal input to the select terminal 12a of the selector 12 is "0", the selector 12 is made to select the output signal of the circuit section 2. On the other hand, if the signal input to the select terminal 12a is "1", the selector 12 is made to select the clock signal supplied from the clock signal generator 9.

Next, in Step S5, a selector 13 of a two-input type is disposed to face the clock terminals of all the flip-flops that have been searched for (in this embodiment, the single flip-flop 22) and the output terminal of the selector 13 is connected to the clock terminal of the flip-flop 22. Moreover, a test mode signal input terminal 7 is provided and connected to a select terminal 13a of the selector 13. Furthermore, the clock signal generator 9 and the clock signal input terminal 5 are connected to the two data input terminals of the selector 13. If the signal input to the select terminal 13a of the selector 13 is "0", the selector 13 is made to select the clock signal supplied from the clock signal generator 9. On the other hand, if the signal input to the select terminal 13a is "1", the selector 13 is made to select the clock signal supplied through the clock signal input terminal 5. At this point in time, the configuration shown in FIG. 4 has been designed.

Finally, in Step S6, a scan path is inserted into the semiconductor integrated circuit shown in FIG. 4. More specifically, the two flip-flops 22 and 23 are replaced by the scan flip-flops 11 and 10, respectively, as shown in FIG. 1. And a scan path is formed to include these flip-flops 11 and 10. In more detail, the scan-in terminal 3, the scan enable signal input terminal 6 and the scan-out terminal 8 are added. The scan enable terminals SE of the flip-flops 11 and 10 are connected to the scan enable signal input terminal 6. The scan-in terminal 3 is connected to the scan-in terminal SI of the scan flip-flop (select signal output circuit) 10. The output terminal Q of the scan flip-flop 10 is connected to the scan-in terminal SI of the scan flip-flop 11. And the output terminal Q of the scan flip-flop 11 is connected to the scan-out terminal 8. As a result, the semiconductor integrated circuit shown in FIG. 1 is completed.

EMBODIMENT 2

Figure 5:
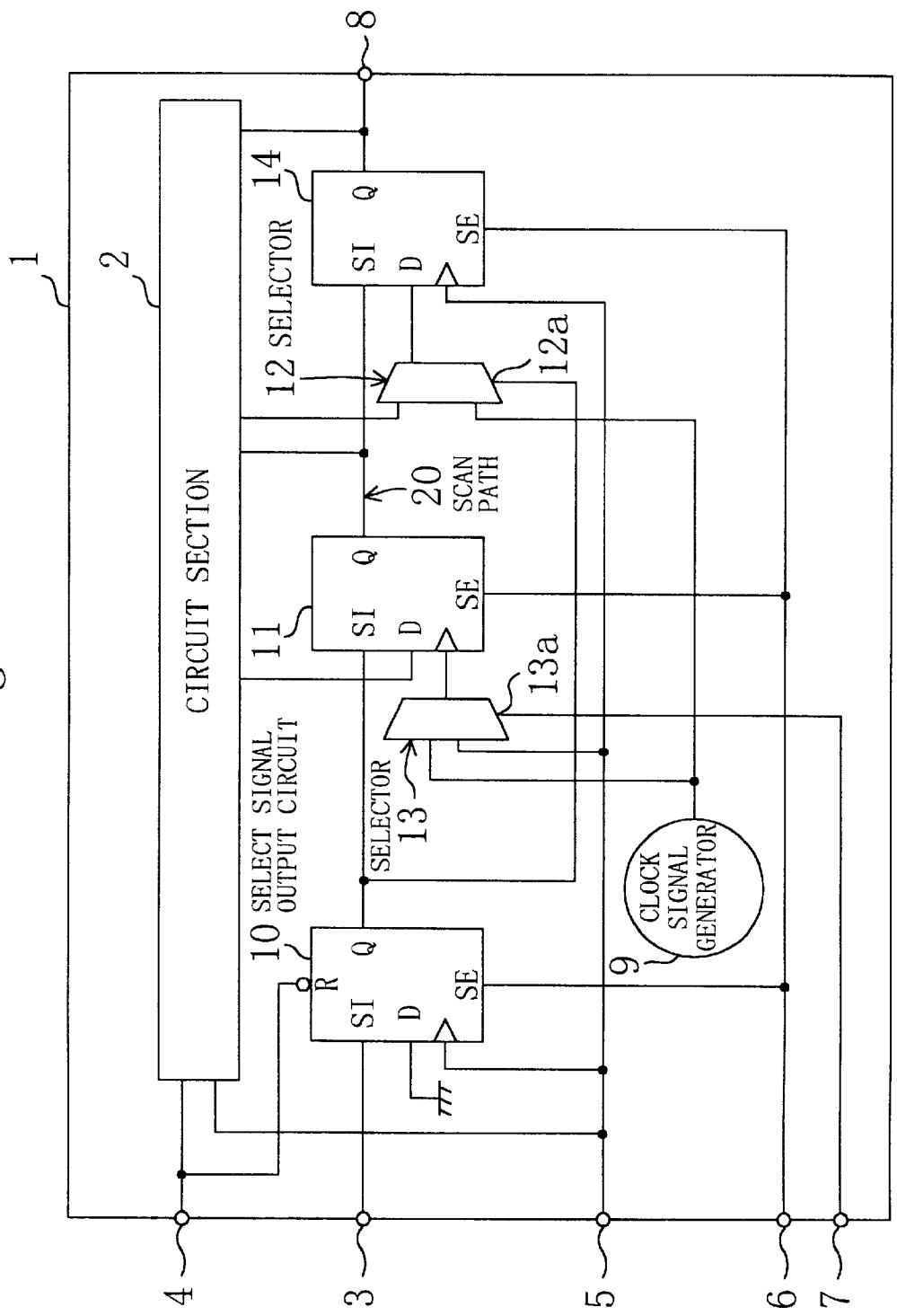
FIG. 5 is a block diagram illustrating the configuration of a semiconductor integrated circuit in the second embodiment of the present invention.

FIG. 5 illustrates a semiconductor integrated circuit in the second embodiment of the present invention. In the first embodiment, the clock signal generated by the clock signal generator 9 reaches both the terminal D and the clock signal terminal of the scan flip-flop 11. Thus, when timing is analyzed statically by using a static timing analyzer, the static timing analyzer may report a set up error or a hold error as to the scan flip-flop 11. This embodiment is effective in eliminating such a problem.

As shown in FIG. 5, the clock signal externally supplied through the clock signal input terminal (control terminal) 5 is supplied to the clock signal input terminal (control terminal) of the scan flip-flop (second storage device) 14. But the clock signal generated by the clock signal generator 9 is not supplied to the clock signal input terminal of the scan flip-flop 14. The scan flip-flop 14 receives the clock signal, generated by the clock signal generator 9, only at the terminal D via the selector 12.

The reference numeral 11 denotes a scan flip-flop (first storage device) having a similar internal configuration to that of the scan flip-flop 14. The scan flip-flops 11 and 14 form a scan path 20. Either the clock signal generated by the clock signal generator 9 or the clock signal externally supplied through the clock signal input terminal 5 is selected by the selector (second selector) 13 and supplied to the clock signal input terminal (control terminal) of the scan flip-flop 11. If the test mode signal supplied through the test mode signal input terminal 7 is "0" (i.e., during the normal operation), the selector 13 selects the clock signal generated by the clock signal generator 9. On the other hand, if the test mode signal is "1" (i.e., during the test mode), the selector 13 selects the external clock signal supplied through the clock signal input terminal 5.

The remaining configuration is the same as that of the first embodiment. Thus, the same components are identified by the same reference numerals and the description thereof will be omitted herein.

Hereinafter, the operation of the semiconductor integrated circuit of the second embodiment will be described with reference to FIG. 5.

First, during the normal operation, the signals at the scan enable signal input terminal 6 and the test mode signal input terminal 7 are fixed at "0". Thus, the scan flip-flops 10, 11, 14 take in the signals received at the respective terminals D and operate as normal flip-flops. The selector 13 selects the clock signal supplied from the clock signal generator 9. As described above, the terminal D of the scan flip-flop 10 is grounded. Thus, when the reset signal "0" is input through the system reset signal input terminal 4 or when the system clock signal is input through the clock signal input terminal 5, the signal at the terminal Q of the scan flip-flop 10 becomes "0". And the signal will remain "0" throughout the normal operation. As a result, the selector 12 always selects the output signal of the circuit section 2.

On the other hand, during the test mode, the signal at the test mode signal input terminal 7 is fixed at "1". Thus, the selector 13 selects the scan clock signal supplied through the clock signal input terminal 5, and the scan flip-flop 11 can perform a scan operation. In such a case, the scan-in terminal 3, the scan flip-flops 10, 11, 14 and the scan-out terminal 8 constitute the scan path 20. If a scan enable signal "1" is received at the scan enable signal input terminal 6, then the scan flip-flops 10, 11, 14 operate as shift registers, thereby performing scan-in/scan-out operations.

Herein, if the output signal of the circuit section 2 is tested, then the scan-in operation is performed, thereby taking the select signal "0" into the scan flip-flop 10. As a result, the selector 12 selects the signal supplied from the circuit section 2. The signal supplied from the circuit section 2 is taken in the scan flip-flop 14 through the terminal D thereof, and is output through the scan-out terminal 8 to the outside by performing the scan-out operation. As a result, the output signal of the circuit section 2 can be monitored at the scan-out terminal 8.

On the other hand, if the clock signal generator 9 is tested, then the select signal "1" is taken into the scan flip-flop 10 through the scan-in operation. As a result, the selector 12 selects the clock signal supplied from the clock signal generator 9. The remaining operation is performed in substantially the same way, thereby taking the clock signal supplied from the clock signal generator 9 into the scan flip-flop 14 through the terminal D and outputting the signal through the scan-out terminal 8 to the outside by performing the scan-out operation. In this way, since the clock signal supplied from the clock signal generator 9 can be monitored at the scan-out terminal 8, it is not necessary to add any external terminal for monitoring the clock signal.

In the semiconductor integrated circuit shown in FIG. 1, when timing is analyzed statically by using a static timing analyzer, the static timing analyzer may report a set up error or a hold error as to the scan flip-flop 11. However, in the semiconductor integrated circuit of the second embodiment, the clock signal generated by the clock signal generator 9 does not reach both the terminal D and the clock signal terminal of the same scan flip-flop. Thus, even when timing is analyzed statically by using a static timing analyzer, no set up error or hold error results from the signal input from the clock signal generator 9. As a result, a designing process can be performed more efficiently.

Assume a case where a storage device (not shown), which is provided in the circuit section 2 for supplying data to the data input terminal D of the scan flip-flop (storage device) 14, operates in response to the clock signal supplied through the clock signal input terminal 5 in the same way as the scan flip-flop 14. Even in such a case, since the selector 12 is provided between these storage devices, the data supplied from the storage device in the circuit section 2 is delayed to a certain degree by the selector 12 so as to reach the data input terminal D of the scan flip-flop 14. As a result, in the scan flip-flop 14, a time lag is caused between the arrival of the data at the data input terminal D and the arrival of the clock signal at the clock signal terminal. Thus, the selector 12 can prevent the data, supplied from the storage device in the circuit section 2, from failing to be taken in the scan flip-flop 14. As a result, an erroneous operation resulting from the failure can be avoided.

Next, a method for designing the semiconductor integrated circuit shown in FIG. 5 by using a computer will be described with reference to the flow chart illustrated in FIG. 6. In actuality, the flow chart is implemented by computer readable programs, which are stored in a storage medium such as a floppy disk or a CD-ROM.

Figure 6:
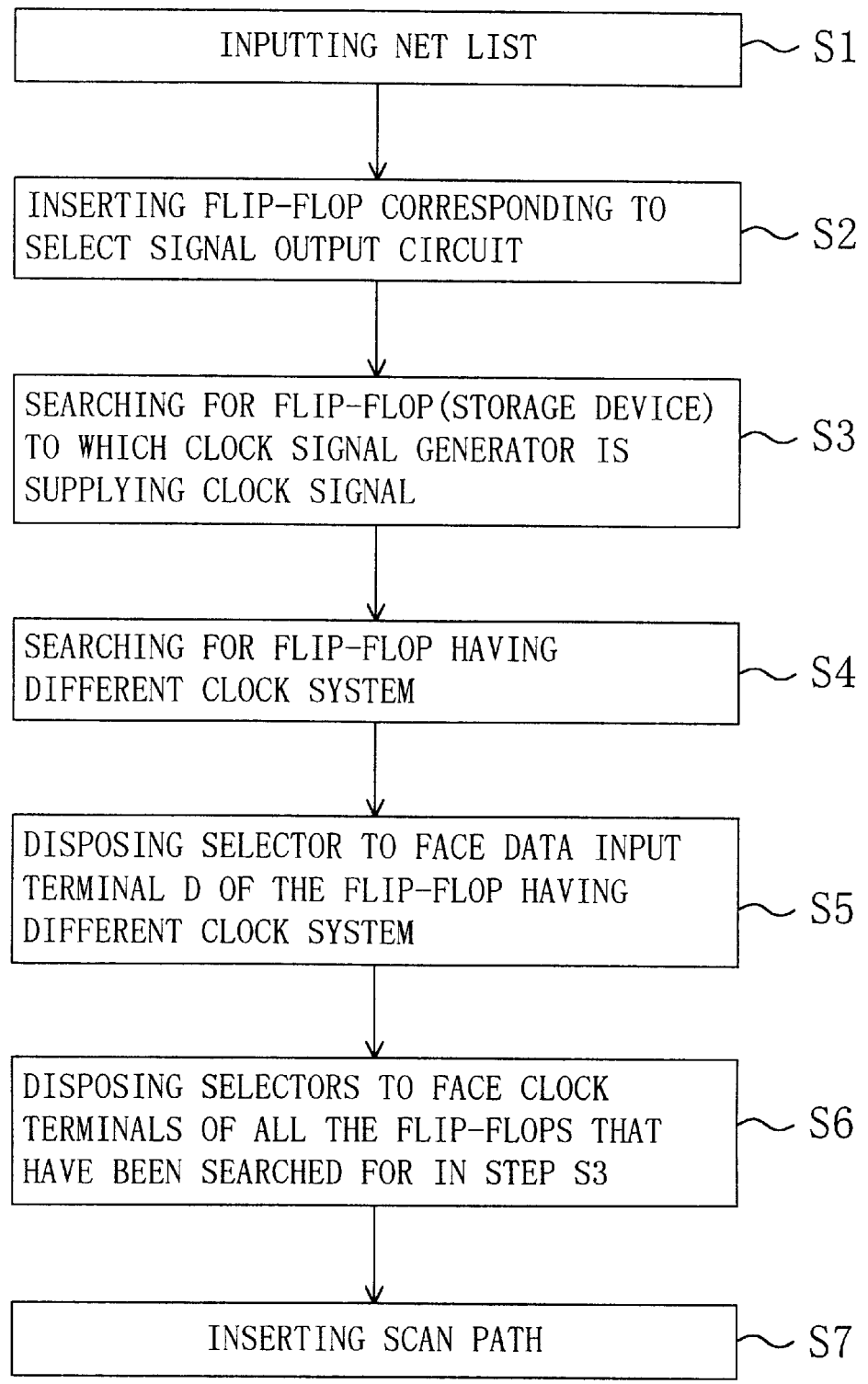
FIG. 6 is a flow chart illustrating a method for designing the semiconductor integrated circuit in the second embodiment of the present invention.
Figure 7:
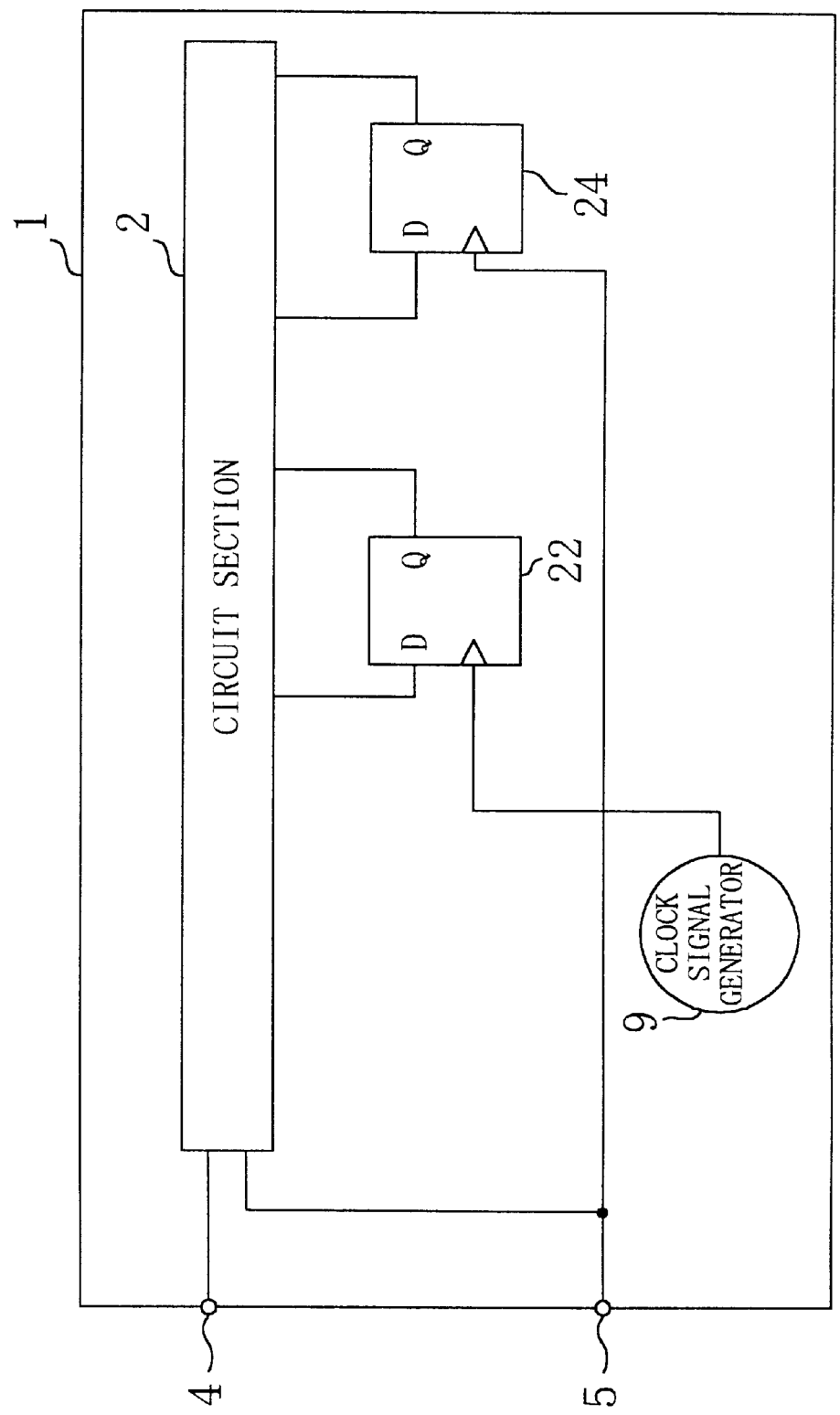
FIG. 7 is a block diagram illustrating the initial circuit configuration of the semiconductor integrated circuit to be tested corresponding to the net list to be input first in the designing method illustrated in FIG. 6.

As shown in FIG. 6, in Step S1, a net list of the semiconductor integrated circuit to be tested and shown in FIG. 7 is input. The semiconductor integrated circuit to be tested basically includes: the circuit section 2; the clock signal generator 9; flip-flops 22 and 24 corresponding to the pair of scan flip-flops 11 and 14; the system reset signal input terminal 4; and the clock signal input terminal 5, as shown in FIG. 7.

Figure 8:
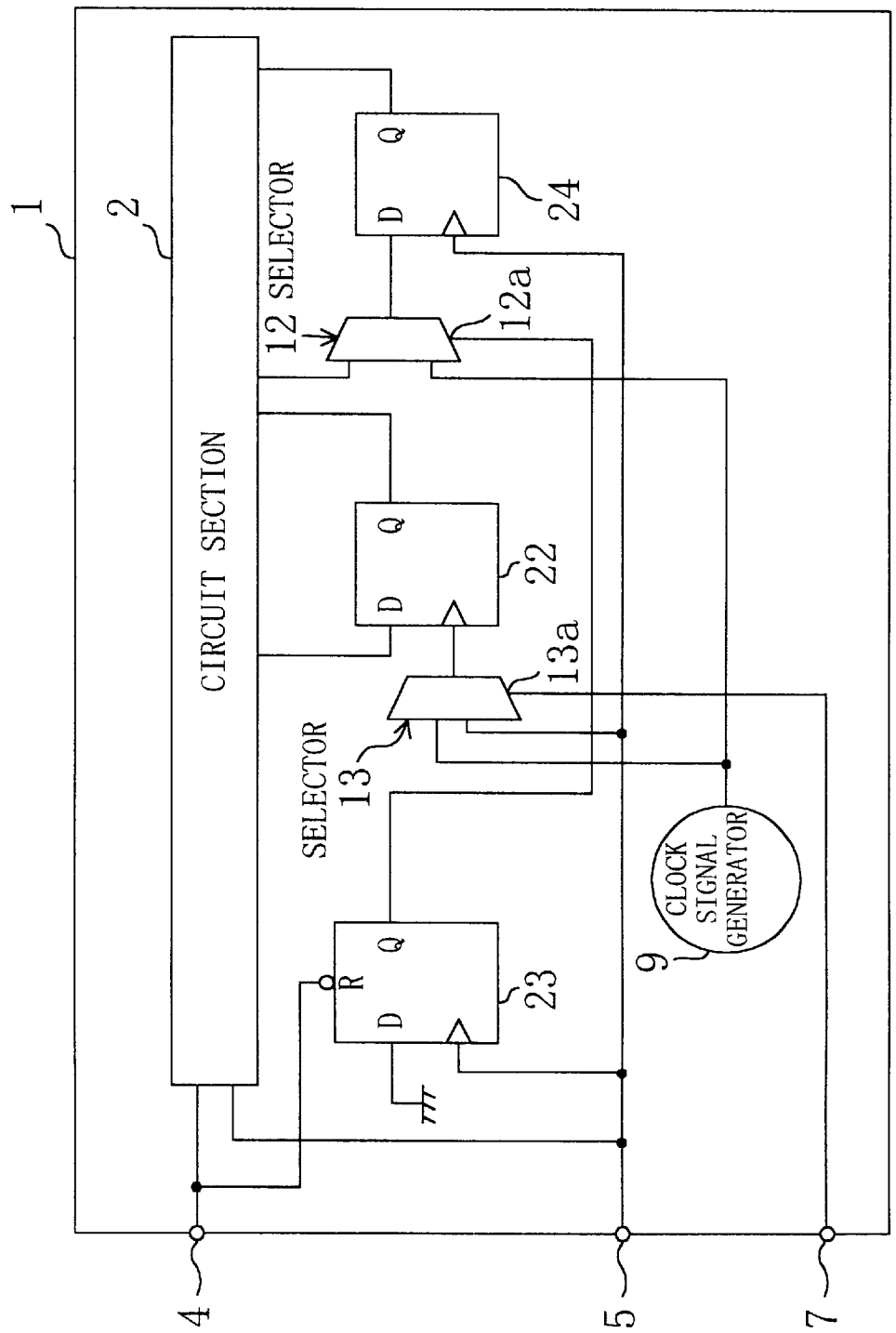
FIG. 8 is a block diagram illustrating the circuit configuration of the semiconductor integrated circuit to be tested at a point in time when a select signal output circuit and selectors have been disposed in accordance with the designing method.

Next, in Step S2, a flip-flop 23 corresponding to the select signal output circuit 10 is inserted into the semiconductor integrated circuit as shown in FIG. 8. And the respective terminals of the flip-flop 23 are connected in the same way as Step S2 of the flow chart illustrated in FIG. 2.

Also, in Step S3, the flip-flop (storage device), to which the clock signal generator 9 is supplying the clock signal, is searched for in the same way as Step S3 of the flow chart illustrated in FIG. 2. In the semiconductor integrated circuit shown in FIG. 7, the flip-flop 22 is searched for.

Subsequently, in Step S4, a flip-flop, to which a clock signal different from the clock signal generated by the clock signal generator 9 is supplied (i.e., a flip-flop having a different clock system), is searched for. Specifically, in the semiconductor integrated circuit shown in FIG. 7, the flip-flop 24, receiving the clock signal through the clock signal input terminal 5, is searched for.

Next, in Step S5, a selector 12 of a two-input type is disposed to face the data input terminal D of the flip-flop 24, which has been searched for and has a different clock system. And the output terminal of the selector 12 is connected to the data input terminal D of the flip-flop 24. In addition, the output terminal Q of the flip-flop 23 corresponding to the select signal output circuit 10 is connected to the select terminal 12a of the selector 12. And the signal supplied from the circuit section 2 during the normal operation and the clock signal supplied from the clock signal generator 9 are connected to the two input terminals of the selector 12. As described above, if the selector 12 is provided, the failure in the transmission of data from the storage device (not shown) in the circuit section 2 to the flip-flop 24 can be advantageously prevented.

Next, in Step S6, a selector 13 of a two-input type is disposed to face the clock terminals of all the flip-flops receiving the clock signal from the clock signal generator 9 (in this embodiment, the single flip-flop 22). And the output terminal of the selector 13 is connected to the clock terminal of the flip-flop 22. Moreover, a test mode signal input terminal 7 is provided and connected to the select terminal 13a of the selector 13. Furthermore, the clock signal generator 9 and the clock signal input terminal 5 are connected to the two data input terminals of the selector 13. At this point in time, the configuration shown in FIG. 8 has been designed.

Finally, in Step S7, a scan path is inserted into the semiconductor integrated circuit shown in FIG. 8. More specifically, the three flip-flops 22, 23 and 24 are replaced by the scan flip-flops 11, 10 and 14, respectively, as shown in FIG. 5. And a scan path is formed to include these flip-flops 11, 10 and 14. In more detail, the scan-in terminal 3, the scan enable signal input terminal 6 and the scan-out terminal 8 are added. The scan enable terminals SE of the flip-flops 11, 10 and 14 are connected to the scan enable signal input terminal 6. The scan-in terminal 3 is connected to the scan-in terminal SI of the scan flip-flop (select signal output circuit) 10. The output terminal Q of the scan flip-flop 10 is connected to the scan-in terminal SI of the scan flip-flop 11. Similarly, the output terminal Q of the scan flip-flop 11 is connected to the scan-in terminal SI of the scan flip-flop 14. And the output terminal Q of the scan flip-flop 14 is connected to the scan-out terminal 8. As a result, the semiconductor integrated circuit shown in FIG. 5 is completed.

EMBODIMENT 3

Figure 9:
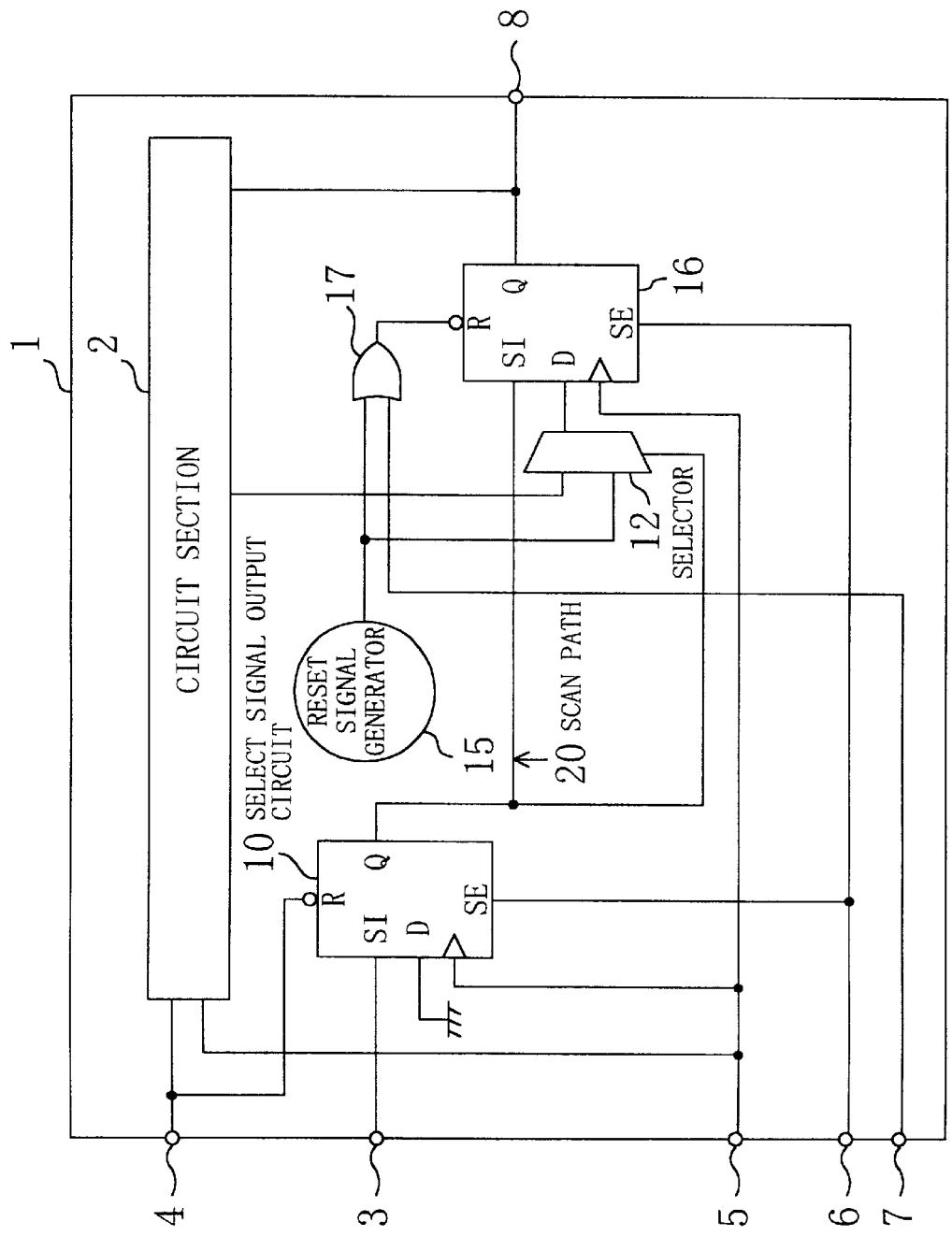
FIG. 9 is a block diagram illustrating the configuration of a semiconductor integrated circuit in the third embodiment of the present invention.

FIG. 9 illustrates a semiconductor integrated circuit in the third embodiment of the present invention.

In FIG. 9, the reference numeral 16 denotes a scan flip-flop constituting the scan path and having the same internal configuration and performing the same function as the scan flip-flop 11 of the first embodiment. The reference numeral 15 denotes a reset signal generator (second circuit section) for generating a reset signal during normal operation. And the reference numeral 17 denotes an OR gate, which receives the reset signal generated by the reset signal generator 15 and the test mode signal supplied through the test mode signal input terminal 7 and supplies the output signal thereof to the terminal R of the scan flip-flop 16.

The remaining configuration is the same as the counterpart of the first embodiment. Thus, the same components are identified by the same reference numerals and the description thereof will be omitted herein.

Hereinafter, the operation of the semiconductor integrated circuit of the third embodiment will be described with reference to FIG. 9.

First, during the normal operation, the signals at the scan enable signal input terminal 6 and the test mode signal input terminal 7 are fixed at "0". Thus, the scan flip-flops 10 and 16 take in the signals received at the respective terminals D and operate as normal flip-flops. The OR gate 17 supplies the reset signal received from the reset signal generator 15 to the scan flip-flop 16 as it is. The terminal D of the scan flip-flop 10 is grounded. Thus, when the reset signal "0" is input through the system reset signal input terminal 4 or when the system clock signal is input through the clock signal input terminal 5, the signal at the terminal Q of the scan flip-flop 10 becomes "0". And the signal will remain "0" throughout the normal operation. As a result, the selector 12 always selects the output signal of the circuit section 2.

On the other hand, during the test mode, since the signal at the test mode signal input terminal 7 is fixed at "1", the output of the OR gate 17 is fixed at "1" and the reset signal is always disabled at the scan flip-flop 16. As a result, the scan flip-flop 16 can perform a scan operation. In such a case, the scan-in terminal 3, the scan flip-flops 10, 16 and the scan-out terminal 8 constitute the scan path 20. If the scan enable signal "1" is received at the scan enable signal input terminal 6, then the scan flip-flops 10, 11 operate as shift registers, thereby performing scan-in/scan-out operations.

Herein, if the signal supplied from the circuit section 2 is tested, then the scan-in operation is performed, thereby taking the select signal "0" into the scan flip-flop 10. As a result, the selector 12 selects the signal supplied from the circuit section 2. Thus, the signal supplied from the circuit section 2 is taken into the scan flip-flop 16 through the terminal D and is monitored at the scan-out terminal 8 through the scan-out operation.

On the other hand, if the reset signal generator 15 is tested, then the select signal "1" is taken into the scan flip-flop 10 through scan-in operation. As a result, the selector 12 selects the reset signal supplied from the reset signal generator 15. Thus, the reset signal supplied from the reset signal generator 15 is taken into the scan flip-flop 16 through the terminal D and is monitored at the scan-out terminal 8 through the scan-out operation.

Accordingly, the reset signal supplied from the reset signal generator 15 can be monitored through the scan test without adding any external terminal for monitoring.

The method for designing the semiconductor integrated circuit shown in FIG. 9 is performed in the same way as the method for designing the semiconductor integrated circuit of the first embodiment. Thus, the description thereof will be omitted herein.

Figure 11:
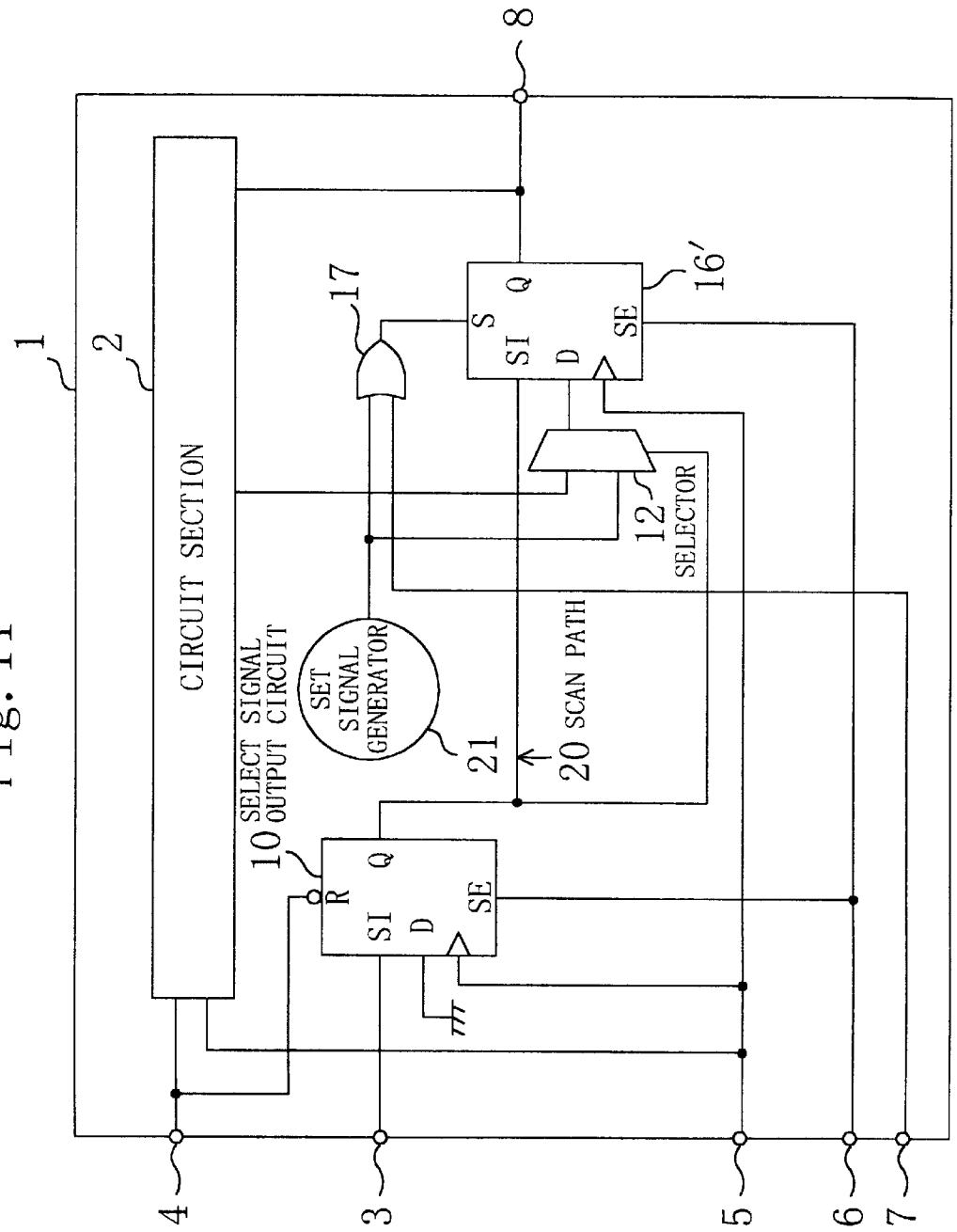
FIG. 11 is a block diagram illustrating a variation of the semiconductor integrated circuit in the third embodiment of the present invention.

In this embodiment, the second circuit section is implemented as the reset signal generator 15. Alternatively, the second circuit section may be naturally implemented as a set signal generator 21 as shown in FIG. 11. In such a case, an alternative scan flip-flop 16' includes a set terminal S in place of the terminal R as shown in FIG. 11.

EMBODIMENT 4

Figure 10:
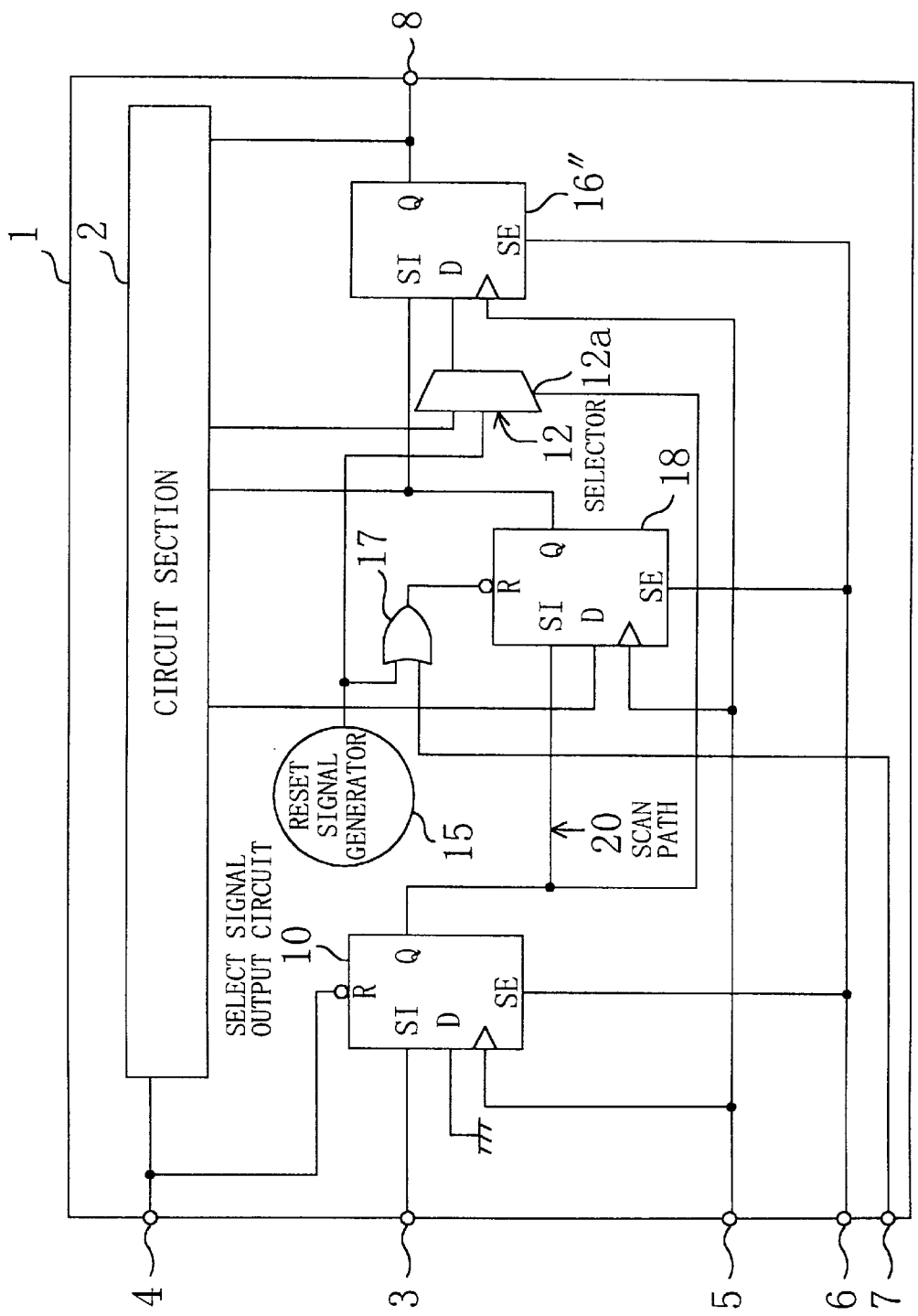
FIG. 10 is a block diagram illustrating the configuration of a semiconductor integrated circuit in the fourth embodiment of the present invention.

FIG. 10 illustrates a semiconductor integrated circuit in the fourth embodiment of the present invention. In the third embodiment, the reset signal generated by the reset signal generator 15 reaches both the terminal R and the terminal D of the scan flip-flop 16. Thus, when timing is analyzed statically by using a static timing analyzer, the static timing analyzer may report a set up error or a hold error as to the scan flip-flop 16. This embodiment is effective in eliminating such a problem.

As shown in FIG. 10, a scan flip-flop 16" does not include any R terminal. The reset signal generated by the reset signal generator 15 is supplied only to the terminal D of the scan flip-flop 16" via the selector 12. A clock signal externally supplied through the clock signal input terminal 5 is supplied to the clock signal input terminal of the scan flip-flop 16".

The reference numeral 18 denotes a scan flip-flop (third storage device) including an R terminal in the same way as the scan flip-flop 16 of the third embodiment. The scan flip-flops 18 and 16" form a scan path. The reset signal generated by the reset signal generator 15 or the test mode signal supplied through the test mode signal input terminal 7 is selectively supplied to the terminal R of the scan flip-flop 18 via the OR gate 17.

The remaining configuration is the same as that of the third embodiment. Thus, the same components are identified by the same reference numerals and the description thereof will be omitted herein.

Hereinafter, the operation of the semiconductor integrated circuit of the fourth embodiment will be described with reference to FIG. 10.

First, during the normal operation, the signals at the scan enable signal input terminal 6 and the test mode signal input terminal 7 are fixed at "0". Thus, the scan flip-flops 10, 16", 18 take in the signals received at the respective terminals D and operate as normal flip-flops. The OR gate 17 supplies the reset signal received from the reset signal generator 15 to the scan flip-flop 18 as it is. The terminal D of the scan flip-flop 10 is grounded. Thus, when the reset signal "0" is input through the system reset signal input terminal 4 or when the system clock signal is input through the clock signal input terminal 5, the signal at the terminal Q of the scan flip-flop 10 becomes "0". And the signal will remain "0" throughout the normal operation. As a result, the selector 12 always selects the output signal of the circuit section 2.

On the other hand, during the test mode, since the test mode signal at the test mode signal input terminal 7 is fixed at "1", the output of the OR gate 17 is fixed at "1" and the reset signal at the scan flip-flop 18 is always disabled. As a result, the scan flip-flop 18 can perform a scan operation. In such a case, the scan-in terminal 3, the scan flip-flops 10, 18, 16" and the scan-out terminal 8 constitute the scan path 20. If the scan enable signal "1" is received at the scan enable signal input terminal 6, then the scan flip-flops 10, 18, 16" operate as shift registers, thereby performing scan-in/scan-out operations.

Herein, if the signal supplied from the circuit section 2 is tested, then the scan-in operation is performed, thereby taking the select signal "0" into the scan flip-flop 10. As a result, the selector 12 selects the signal supplied from the circuit section 2. As described above, the signal supplied from the circuit section 2 is taken into the scan flip-flop 16" through the terminal D, and can be monitored at the scan-out terminal 8 through the scan-out operation.

On the other hand, if the reset signal generator 15 is tested, then the select signal "1" is taken into the scan flip-flop 10 through the scan-in operation. As a result, the selector 12 selects the reset signal supplied from the reset signal generator 15. Thus, as described above, the reset signal supplied from the reset signal generator 15 is taken into the scan flip-flop 16" through the terminal D and can be monitored at the scan-out terminal 8 through the scan-out operation.

Consequently, the reset signal supplied from the reset signal generator 15 can be monitored through the scan test without adding any external terminal for monitoring.

In the semiconductor integrated circuit shown in FIG. 9, when timing is analyzed statically by using a static timing analyzer, the static timing analyzer may report a set up error or a hold error as to the scan flip-flop 16. However, in the semiconductor integrated circuit of the fourth embodiment, the reset signal generated by the reset signal generator 15 does not reach both the terminals R and D of the same scan flip-flop. Thus, even when timing is analyzed statically by using a static timing analyzer, no set up error or hold error results from the signal input from the reset signal generator 15. As a result, a designing process can be performed more efficiently.

The method for designing the semiconductor integrated circuit shown in FIG. 10 is performed in the same way as the method for designing the semiconductor integrated circuit of the second embodiment. Thus, the description thereof will be omitted herein.

Figure 12:
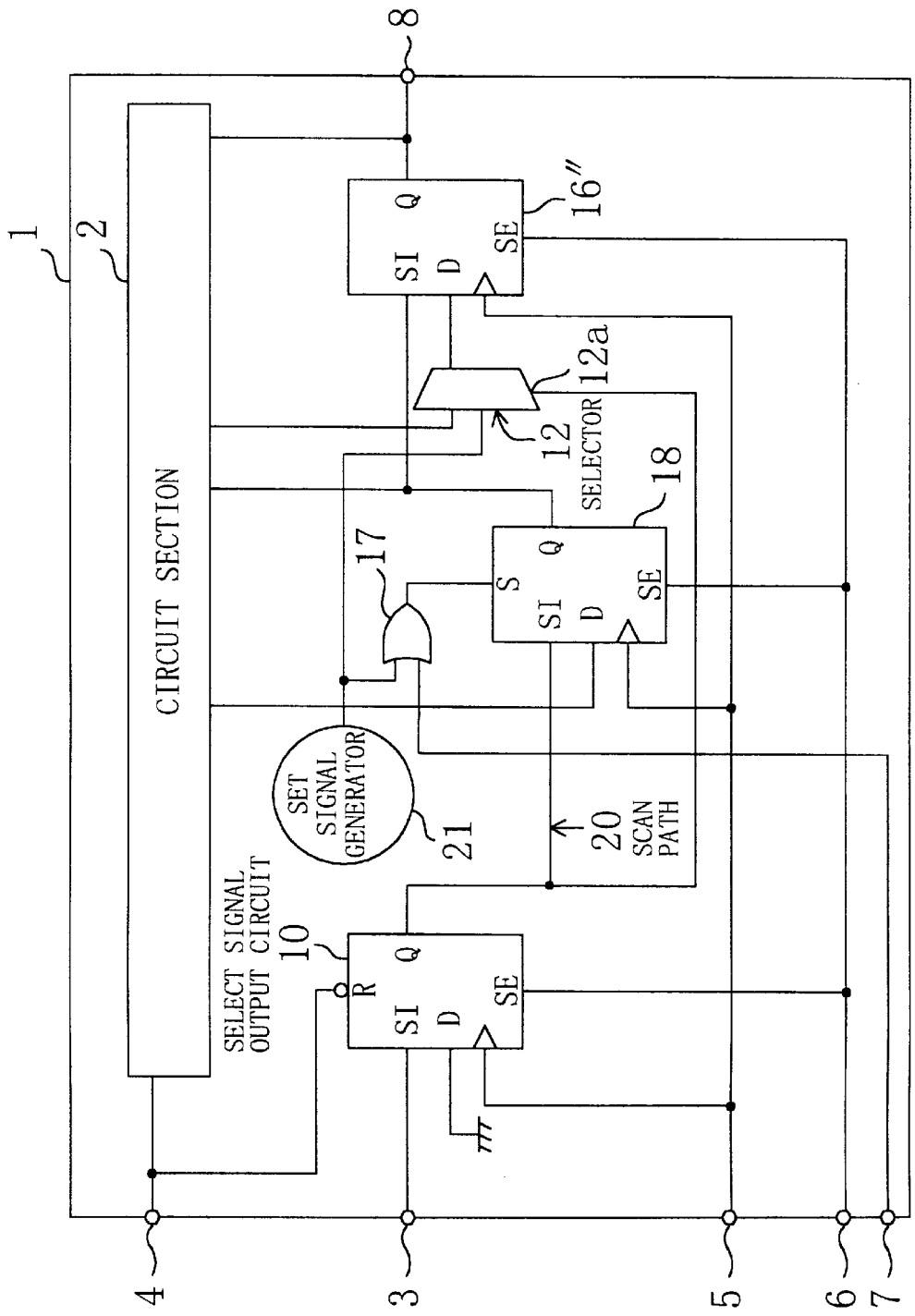
FIG. 12 is a block diagram illustrating a variation of the semiconductor integrated circuit in the fourth embodiment of the present invention.

In this embodiment, the second circuit section is implemented as the reset signal generator 15. Alternatively, the second circuit section may be naturally implemented as a set signal generator 21 as shown in FIG. 12. In such a case, the scan flip-flop 18 includes a set terminal S in place of the terminal R as shown in FIG. 12.

In the foregoing description, the second circuit section is implemented as the clock signal generator 9, the reset signal generator 15 or the set signal generator 21. However, the present invention is not limited thereto. For example, in the case of a complicated combinational circuit, a part of the combinational circuit may be implemented as the second circuit section or a sequential circuit may be implemented as the second circuit section.

What is claimed is:

1. A semiconductor integrated circuit comprising:
    a storage device including a data input terminal and a control terminal and constituting a part of a scan path;
    a first circuit section for generating data to be supplied to the data input terminal of the storage device during normal operation; and
    a second circuit section for generating a signal to be supplied to the control terminal of the storage device during the normal operation;
    wherein the semiconductor integrated circuit further comprises:
        a selector for selecting one of an output signal of the first circuit section and an output signal of the second circuit section and supplying the selected signal to the data input terminal of the storage device; and
        a select signal output circuit for outputting a select signal to the selector, the select signal instructing a select operation of the selector,
        and wherein the select signal output circuit outputs the select signal instructing that the selector selects the output signal of the first circuit section during the normal operation and outputs the select signal instructing that the selector selects an arbitrary one of the output signal of the first circuit section and the output signal of the second circuit section during testing the semiconductor integrated circuit.

2. The semiconductor integrated circuit of claim 1, wherein the control terminal is a clock signal input terminal, and wherein the second circuit section is a clock signal generator for generating a clock signal.

3. The semiconductor integrated circuit of claim 2, further comprising a second selector,
    wherein the second selector selects the output signal of the second circuit section during the normal operation, selects a clock signal supplied from a circuit other than the second circuit section during testing the semiconductor integrated circuit and supplies the selected signal to the control terminal of the storage device.

4. A semiconductor integrated circuit comprising:
    a first storage device including a control terminal and constituting a part of a scan path;
    a second storage device including a data input terminal and constituting another part of the scan path;
    a first circuit section for generating data to be supplied to the data input terminal of the second storage device during normal operation; and
    a second circuit section for generating a signal to be supplied to the control terminal of the first storage device during the normal operation;
    wherein the semiconductor integrated circuit further comprises:
        a selector for selecting one of an output signal of the first circuit section and an output signal of the second circuit section and supplying the selected signal to the data input terminal of the second storage device; and
        a select signal output circuit for outputting a select signal to the selector, the select signal instructing a select operation of the selector,
        and wherein the select signal output circuit outputs the select signal instructing that the selector selects the output signal of the first circuit section during the normal operation and outputs the select signal instructing that the selector selects an arbitrary one of the output signal of the first circuit section and the output signal of the second circuit section during testing the semiconductor integrated circuit.

5. The semiconductor integrated circuit of claim 4, wherein the control terminal is a clock signal input terminal, and wherein the second circuit section is a clock signal generator for generating a clock signal.

6. The semiconductor integrated circuit of claim 5, further comprising a second selector,
wherein the second selector selects the output signal of the second circuit section during the normal operation, selects a clock signal supplied from a circuit other than the second circuit section during testing the semiconductor integrated circuit and supplies the selected signal to the control terminal of the first storage device.

7. The semiconductor integrated circuit of one of claims 1 and 4, wherein the control terminal is a reset signal input terminal, and wherein the second circuit section is a reset signal generator for generating a reset signal.

8. The semiconductor integrated circuit of one of claims 1 and 4, wherein the control terminal is a set signal input terminal, and wherein the second circuit section is a set signal generator for generating a set signal.

9. The semiconductor integrated circuit of one of claims 1 and 4, wherein the select signal output circuit comprises a third storage device constituting the scan path,
and wherein the third storage device receives the select signal externally supplied through the scan path and outputs the received select signal to the selector.

10. The semiconductor integrated circuit of claim 9, wherein the third storage device comprises:
a data input terminal for always receiving a select signal instructing that the selector selects the output signal of the first circuit section;
a scan data input terminal for receiving the select signal externally supplied through the scan path; and
an output terminal for outputting the select signal to the selector,
and wherein the third storage device receives a scan enable signal externally supplied, outputs the select signal, received at the data input terminal, through the output terminal while the scan enable signal is not input, and outputs the select signal, received at the scan data input terminal, through the output terminal while the scan enable signal is input.

11. A method for designing a semiconductor integrated circuit for testing the operation of an internal circuit,
the method comprising the steps of:
inputting a net list of a semiconductor integrated circuit including: a storage device including a data input terminal and a control terminal; a first circuit section for generating data to be supplied to the data input terminal of the storage device; and a second circuit section for generating a signal to be supplied to the control terminal of the storage device;
adding a selector and a select signal output circuit to the semiconductor integrated circuit, the selector selecting one of an output signal of the first circuit section and an output signal of the second circuit section and supplying the selected signal to the data input terminal of the storage device, the select signal output circuit outputting a select signal, instructing a select operation of the selector, to the selector; and
constituting the storage device by a scan flip-flop and inserting a scan path, including the scan flip-flop, into the semiconductor integrated circuit.

12. The method of claim 11, wherein the control terminal is a clock signal input terminal, and wherein the second circuit section is a clock signal generator for generating a clock signal.

13. The method of claim 12, further comprising the step of adding a second selector to the semiconductor integrated circuit,
the second selector selecting one of the output signal of the second circuit section and a clock signal supplied from a circuit other than the second circuit section and supplying the selected signal to the control terminal of the storage device.

14. A method for designing a semiconductor integrated circuit for testing the operation of an internal circuit,
the method comprising the steps of:
inputting a net list of a semiconductor integrated circuit including: a first storage device including a control terminal; a second storage device including a data input terminal; a first circuit section for generating data to be supplied to the data input terminal of the second storage device; and a second circuit section for generating a signal to be supplied to the control terminal of the first storage device;
adding a selector and a select signal output circuit to the semiconductor integrated circuit, the selector selecting one of an output signal of the first circuit section and an output signal of the second circuit section and supplying the selected signal to the data input terminal of the second storage device, the select signal output circuit outputting a select signal, instructing a select operation of the selector, to the selector; and
constituting the first and second storage devices by scan flip-flops, respectively, and inserting a scan path, including the scan flip-flops, into the semiconductor integrated circuit.

15. The method of claim 14, wherein the control terminal is a clock signal input terminal, and wherein the second circuit section is a clock signal generator for generating a clock signal.

16. The method of claim 15, further comprising the step of adding a second selector to the semiconductor integrated circuit,
the second selector selecting one of the output signal of the second circuit section and a clock signal supplied from a circuit other than the second circuit section and supplying the selected signal to the control terminal of the first storage device.

17. The method of one of claims 11 and 14, wherein the control terminal is a reset signal input terminal, and wherein the second circuit section is a reset signal generator for generating a reset signal.

18. The method of one of claims 11 and 14, wherein the control terminal is a set signal input terminal, and wherein the second circuit section is a set signal generator for generating a set signal.

19. The method of one of claims 11 and 14, wherein in the step of inserting the scan path into the semi conductor integrated circuit, the select signal output circuit is constituted by a scan flip-flop and inserted into the scan path.

20. A storage medium in which a design program for designing a semiconductor integrated circuit testing the operation of an internal circuit is stored,
the design program comprising the steps of:
input ting a net list of a semiconductor integrated circuit including: a storage device including a data input terminal and a control terminal; a first circuit section for generating data to be supplied to the data input terminal of the storage device; and a second circuit section for generating a signal to be supplied to the control terminal of the storage device;
adding a selector and a select signal output circuit to the semiconductor integrated circuit, the selector selecting one of an output signal of the first circuit section and an output signal of the second circuit section and supplying the selected signal to the data input terminal of the storage device, the select signal output circuit outputting a select signal, instructing a select operation of the selector, to the selector; and constituting the storage device by a scan flip-flop and inserting a scan path, including the scan flip-flop, into the semiconductor integrated circuit.

21. The storage medium of claim 20, wherein the control terminal is a clock signal input terminal, and wherein the second circuit section is a clock signal generator for generating a clock signal.

22. The storage medium of claim 21, further comprising the step of adding a second selector to the semiconductor integrated circuit, the second selector selecting one of the output signal of the second circuit section and a clock signal supplied from a circuit other than the second circuit section and supplying the selected signal to the control terminal of the storage device.

23. A storage medium in which a design program for designing a semiconductor integrated circuit testing the operation of an internal circuit is stored, the design program comprising the steps of:

inputting a net list of a semiconductor integrated circuit including: a first storage device including a control terminal; a second storage device including a data input terminal; a first circuit section for generating data to be supplied to the data input terminal of the second storage device; and a second circuit section for generating a signal to be supplied to the control terminal of the first storage device;

adding a selector and a select signal output circuit to the semiconductor integrated circuit, the selector selecting one of an output signal of the first circuit section and an output signal of the second circuit section and supplying the selected signal to the data input terminal of the second storage device, the select signal output circuit outputting a select signal, instructing a select operation of the selector, to the selector; and constituting the first and second storage devices by scan flip-flops, respectively, and inserting a scan path, including the scan flip-flops, into the semiconductor integrated circuit.

24. The storage medium of claim 23, wherein the control terminal is a clock signal input terminal, and wherein the second circuit section is a clock signal generator for generating a clock signal.

25. The storage medium of claim 24, further comprising the step of adding a second selector to the semiconductor integrated circuit, the second selector selecting one of the output signal of the second circuit section and a clock signal supplied from a circuit other than the second circuit section and supplying the selected signal to the control terminal of the first storage device.

26. The storage medium of one of claims 20 and 23, wherein the control terminal is a reset signal input terminal, and wherein the second circuit section is a reset signal generator for generating a reset signal.

27. The storage medium of one of claims 20 and 23, wherein the control terminal is a set signal input terminal, and wherein the second circuit section is a set signal generator for generating a set signal.

28. The storage medium of one of claims 20 and 23, wherein in the step of the design program of inserting the scan path into the semiconductor integrated circuit, the select signal output circuit is constituted by a scan flip-flop and inserted into the scan path.

\* \* \* \* \*